United States Patent [19]

Lyon et al.

[11] Patent Number: 5,185,607
[45] Date of Patent: Feb. 9, 1993

[54] METHOD AND APPARATUS FOR TESTING AN ANALOG TO DIGITAL CONVERTER

[75] Inventors: Jose A. Lyon; Jules D. Campbell, Jr., both of Austin, all of Tex.

[73] Assignee: Motorola, Inc., Schaumburg, Ill.

[21] Appl. No.: 829,113

[22] Filed: Jan. 31, 1992

[51] Int. Cl.⁵ ............................................. H03M 1/10
[52] U.S. Cl. .................................. 341/120; 324/73.1
[58] Field of Search ............... 341/120, 155; 324/73.1, 324/549

[56] References Cited

U.S. PATENT DOCUMENTS

| | | | |
|---|---|---|---|
| 3,919,504 | 11/1975 | Crosley et al. | 179/175.2 |
| 4,625,310 | 11/1986 | Mercer | 371/15 |
| 4,674,090 | 6/1987 | Chen et al. | 371/25 |
| 4,679,028 | 7/1987 | Wilson et al. | 341/120 |
| 4,724,341 | 2/1988 | Yamada et al. | 307/449 |
| 4,789,825 | 12/1988 | Carelli et al. | 324/158 |
| 4,893,311 | 1/1990 | Hunter et al. | 371/22.5 |
| 4,897,650 | 1/1990 | Shott, III et al. | 341/120 |
| 4,947,106 | 8/1990 | Chism | 324/73.1 |
| 4,972,144 | 11/1990 | Lyon et al. | 524/158 T |
| 5,063,383 | 11/1991 | Bobba | 341/120 |

FOREIGN PATENT DOCUMENTS 35661 2/1987 Japan ........................... 324/158 T Primary Examiner—Marc Hoff
Attorney, Agent, or Firm—Susan C. Hill

[57] ABSTRACT

A method and apparatus for testing an analog to digital converter (14) having a resistor digital to analog converter (32). In one form, the analog to digital converter uses a small amount of resistor test logic (44) to test for defects in the resistor array (42), the switch array (38), and the optional decode logic (36). Instead of performing time-consuming analog to digital conversions, the functionality of the above mentioned circuitry, which includes some analog circuitry, is tested by using a pull-up function and a pull-down function that can be overdriven by properly functioning circuitry. As a result of using resistor test logic (44), a very quick pass/fail functional test using digital logic levels as inputs can be performed on the analog to digital converter (14). The quick functional test does not require analog inputs or time-consuming analog to digital conversions.

20 Claims, 5 Drawing Sheets

METHOD AND APPARATUS FOR TESTING AN ANALOG TO DIGITAL CONVERTER

REFERENCE TO RELATED APPLICATIONS

The present application is related to the following U.S. patent application which is filed of even date herewith: U.S. Application Ser. No. 07/829,136, titled "A Method and Apparatus for Testing an Analog to Digital Converter".

FIELD OF THE INVENTION

The present invention relates in general to analog to digital converters (ADCs), and more particularly to testing ADCs.

BACKGROUND OF THE INVENTION

Analog to digital converters (ADCs) are used to convert an analog input signal to an equivalent digital output signal. ADCs are required in a variety of applications where an analog signal must be converted to a digital signal in order to allow digital data processing.

Most digital data processing systems are not able to directly use an analog signal. Therefore, most analog values must be converted to an equivalent digital value by an ADC before a digital system can use the value. As a consequence, most digital data processing systems include an ADC if analog values are to be received by the system. Some microcomputer chips even include an ADC on board the microcomputer chip.

Fault grading is performed on a semiconductor chip design in order to increase reliability. The goal of fault grading is to generate tests which fully exercise all of the thousands or millions of individual devices and nodes within the chip in order to ensure that all of the devices and nodes function properly. Fault grading increases the reliability of chips which are manufactured using the fault graded design.

One set of nodes that is difficult to fault grade in a chip design is the first electrode of the capacitors used in an ADC. Fault grading of this set of nodes not only allows the capacitors themselves to be tested for various types of shorts, but in addition, allows the drive logic used to drive the first electrode of each capacitor to be tested. If resistors are used in place of some or all of the capacitors, then the set of nodes that is difficult to fault grade is the intermediate nodes between each resistive value. One of the reasons for the difficulty is that the voltages on these nodes are not digital voltages, but rather are analog voltages.

It is difficult to test and fault grade an analog structure such as the capacitors and resistors used in an ADC because the normal inputs to these analog structures are analog voltages. These analog input voltages cannot easily be generated with digital test equipment that uses only digital inputs and outputs. The digital testing equipment for a digital data processing system, such as a microcomputer chip, uses primarily digital input and output signals. The testing equipment may be able to use analog input and output signals, but such analog testing generally requires more testing time. Thus it is generally more efficient and less costly to perform tests that use digital rather than analog input and output signals.

In addition to fault grading the ADC design, each ADC chip that is manufactured must be individually tested using a linearity test, such as a full ramp test. This linearity test uses analog inputs to test the accuracy of the ADC over the full range of possible input and output values. A linearity test requires the ADC to perform hundreds or thousands of time-consuming analog to digital conversions. Linearity testing requires a great deal of time and is thus very costly. Therefore, it is desirable to find a way to test ADCs that requires less time, uses minimal additional circuitry in the ADC, and uses digital rather than analog inputs.

In present ADCs, the linearity test is often the only test method used to determine if the capacitors and/or resistors are defective. A linearity test requires the ADC to perform an analog to digital conversion for every inputted analog value. A partial linearity test is a linearity test which uses as imputs only a selected group of analog values within the input signal range. Although a partial linearity test is used to save test time in determining if the capacitors and/or resistors are defective, it still requires a significant number of analog to digital conversions.

A defect in the capacitors and/or resistors which determine the most significant bits of the digital output is easy to detect using a partial linearity test because an error in the most significant bits will not be masked by small errors due to other causes. However, a defect in the capacitors and/or resistors which determine the least significant bits of the digital output is harder to detect because an error in the least significant bits may be masked by small errors due to other causes, such as component mismatch. As a result, defects in certain ADC capacitors and resistors are difficult to detect a using a partial linearity test. Thus linearity tests, including partial linearity tests, are time consuming, costly, and may have trouble catching defects in certain ADC capacitors and resistors.

SUMMARY OF THE INVENTION

The previously mentioned needs are fulfilled and other advantages achieved with the present invention. In one form, the present invention comprises an apparatus and a method for testing circuitry in an analog to digital converter (ADC). The ADC has a plurality of resistors connected in series to form a resistor array with a first end and a second end. The test apparatus has first logic coupled to the first end of the resistor array for applying an analog voltage level to the first end of the resistor array when the ADC is not in a special test mode. The first logic also applies a first digital voltage level to the first end of the resistor array when the ADC is in a special test mode.

The ADC has second logic coupled to at least two of the plurality of resistors for selectively coupling a portion of the resistor array to an output signal having a second voltage level which is analog when the ADC is not in the special test mode and which is digital when the ADC is in the special test mode.

In addition, the ADC has third logic which is used only in the special test mode. The third logic is coupled to the second logic means and the first end of the resistor array. The third logic compares the first voltage level of the first end of the resistor array to the second voltage level of the output signal. The third logic also produces a comparison result.

The present invention will be understood by one skilled in the art from the detailed description below in conjunction with the accompanying drawings.

DESCRIPTION OF THE PREFERRED EMBODIMENT

One possible solution to the above-mentioned problems is a basic digital functional test that can determine functionality of key ADC circuitry without requiring any time-consuming analog to digital conversions. If a very quick, basic digital functional test is performed first, it will be able to detect defects and reject defective ADCs before any time-consuming linearity tests are performed. Note that linearity testing may still be required to test the accuracy of an ADC that has passed the basic digital functional test. But, by using a basic digital functional test first, costly linearity testing will not be wasted on ADCs that have basic defects and must be rejected.

Thus, a way to test analog structures in an ADC using digital inputs and outputs was needed. The present invention allows a fast, inexpensive, and more reliable test to be performed on an ADC in order to determine if some of the fundamental circuitry, including analog circuitry, is functional. In the past, a time consuming and expensive linearity test using analog inputs was required in order to find the same types of errors. In addition, fault grading to catch these types of error was extremely difficult.

The terms "assert" and "negate" will be used when referring to the rendering of a signal or similar apparatus into its logically true or logically false state, respectively. The term "logic level zero" will be used when referring to a digital voltage level that corresponds to a binary value of "0". The term "logic level one" will be used when referring to a digital voltage level that corresponds to a binary value of "1".

Figure 1:
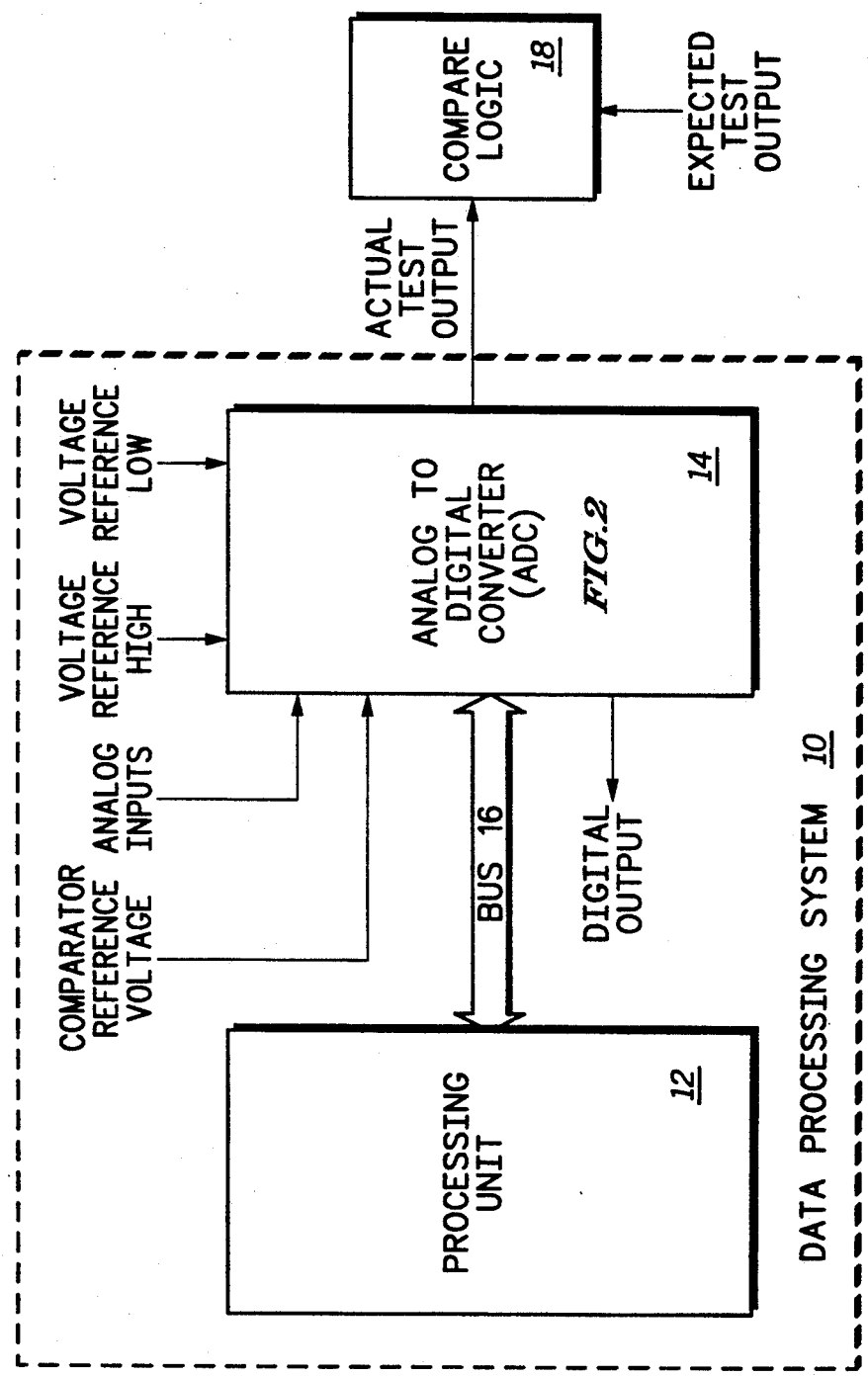
FIG. 1 illustrates, in block diagram form, a data processing system having an analog to digital converter (ADC) in accordance with one embodiment of the present invention.

FIG. 1 illustrates a data processing system 10 which has a processing unit 12 and an analog to digital converter (ADC) 14. A bus 16 transfers information between processing unit 12 and ADC 14. The ADC 14 receives four input signals: an analog input, a comparator reference voltage, a voltage reference high, and a voltage reference low.

The ADC 14 receives the analog input signal and converts it to a digital output signal that is equivalent. This digital output signal may be used internally by another portion (not shown) of the data processing system 10. In one embodiment of the present invention, the digital output is transmitted to the processing unit 12 across bus 16. Also, the digital output may be sent outside the data processing system 10 for use by external devices (not shown). In addition, the digital output may be a serial bus consisting of one conductor, or may be a parallel bus consisting of multiple conductors.

The ADC 14 also generates an output signal called actual test output. Compare logic 18 receives the actual test output signal as well as an expected test output signal. Compare logic 18 compares the actual test output to the expected test output in order to determine if they are the same. If the actual test output is different than the expected test output, then there is an error or defect in ADC 14. Although compare logic 18 is shown as external to data processing system 10, compare logic 18 may alternately be part of data processing system 10, and may even be part of ADC 14. In one embodiment, the compare logic 18 is part of an external testing apparatus (not shown).

Figure 2:
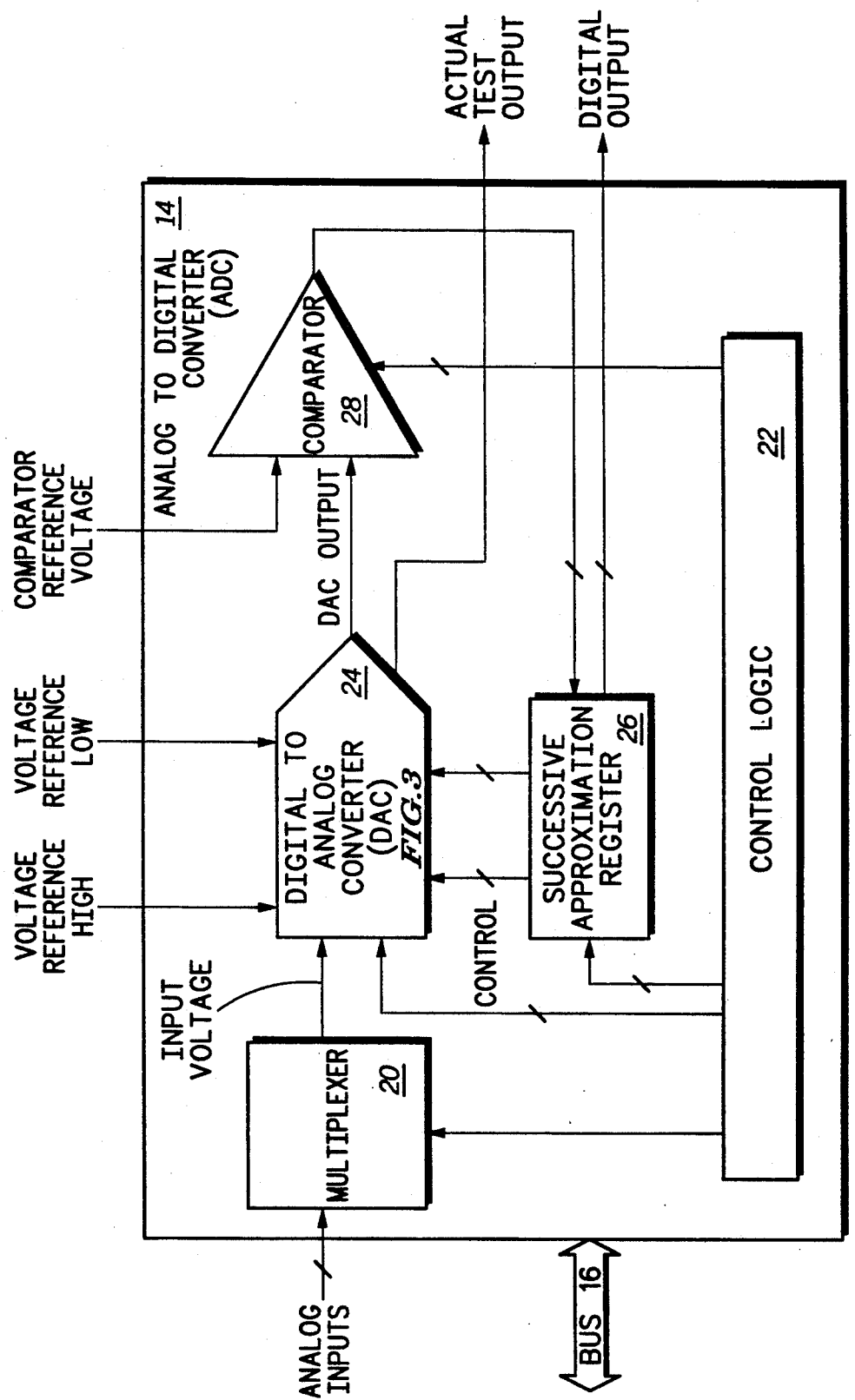
FIG. 2 illustrates, in block diagram form, an ADC of FIG. 1 in accordance with one embodiment of the present invention.

FIG. 2 illustrates one implementation of the analog to digital converter (ADC) 14 of FIG. 1. The bus 16 is used to transmit information to and from ADC 14. A multiplexer 20 receives a control input from control logic circuitry 22. The multiplexer 20 uses this control input to determine which analog input signal is to be outputted to a digital to analog converter (DAC) 24 as an input voltage signal. In addition, DAC 24 receives control signals from control logic 22. The voltage reference high and voltage reference low signals are also inputs to DAC 24. Finally, DAC 24 receives the most recent successive approximation value from a successive approximation register 26.

The successive approximation register 26 receives control information from control logic 22 which is used to determine the new value stored in the successive approximation register 26. Successive approximation register 26 also outputs a digital output that is the result of the analog to digital conversion. In addition, successive approximation register 26 can also be read and written to across bus 16. In the present embodiment, writes from the processing unit 12 to the successive approximation register 26 can only take place when ADC 14 is in a special test mode.

Comparator 28 receives the comparator reference voltage, the DAC output from the DAC 24, and control signals from the control logic 22. Comparator 28 compares the values of the comparator reference voltage and the DAC output and sends control signals to the successive approximation register 26 based on the result of the comparison.

The DAC 24 also generates a test output signal called actual test output. Aside from this special test signal and the circuitry used to generate it, the ADC 14 operates to convert analog inputs to equivalent digital outputs in the same manner as a standard analog to digital converter using successive approximation.

Figure 3:
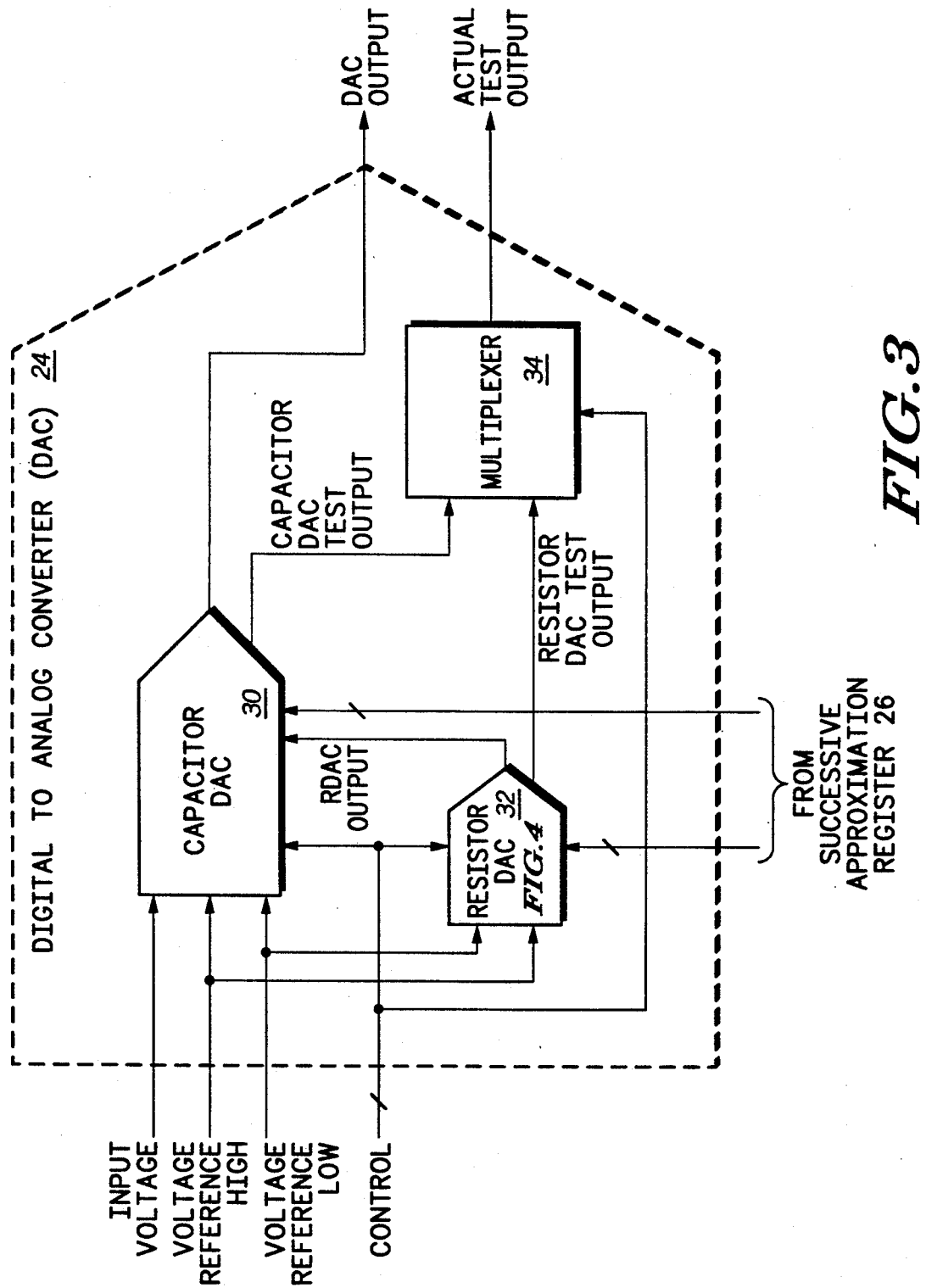
FIG. 3 illustrates, in block diagram form, a digital to analog converter (DAC) of FIG. 2 in accordance with one embodiment of the present invention.

FIG. 3 illustrates one implementation of the digital to analog converter (DAC) 24 of FIG. 2. A capacitor DAC 30 receives the input voltage, the reference voltage high, the reference voltage low, and control signals as inputs. A resistor DAC 32 receives the reference voltage high, the reference voltage low, and control signals as inputs. An output of the resistor DAC 32, called RDAC output, is an input to capacitor DAC 30. Both capacitor DAC 30 and resistor DAC 32 receive inputs from the successive approximation register 26.

In the present embodiment, the resistor DAC 32 receives the lower order bits and the capacitor DAC 30 receives the higher order bits from the successive approximation register 26. A multiplexer 34 receives a capacitor DAC test output signal from capacitor DAC 30, and a resistor DAC test output signal from resistor DAC 32. Multiplexer 34 also receives a control signal that it uses to select which of its two input signals to output as the actual test output signal. Capacitor DAC 30 also outputs a DAC output signal.

Figure 4:
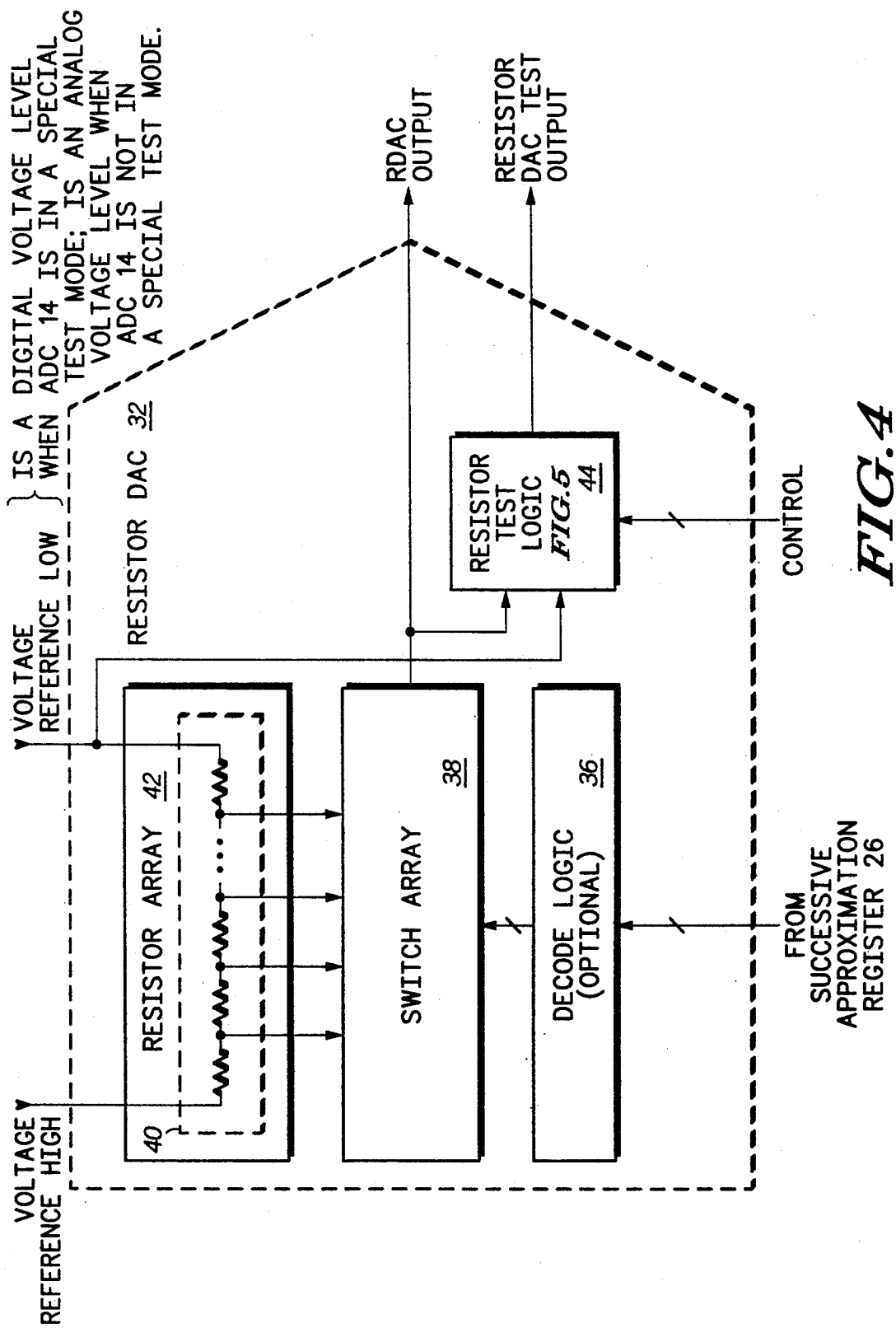
FIG. 4 illustrates, in partial logic diagram form, a resistor DAC of FIG. 3 in accordance with one embodiment of the present invention.

FIG. 4 illustrates one implementation of the resistor DAC 32 of FIG. 3. Decode logic 36 is optional. If decode logic 36 is used, it receives inputs from the successive approximation register 26, decodes these inputs, and transmits output signals to switch array 38. If the decode logic 36 is not used, then switch array 38 directly receives the signals from the successive approximation register 26.

Resistor array 42 contains "N" series connected resistors 40 where "N" is any positive integer number. Resistor array 42 acts as a voltage divider circuit when one end of the series connected resistors 40 is electrically connected to voltage reference high and the other end of the series connected resistors 40 is electrically connected to voltage reference low. The voltage taps between each pair of resistors will be at different intermediate voltages, with the voltage taps nearer to the voltage reference high end being at higher intermediate voltages.

Switch array 38 operates as an analog switch performing a multiplexing function. Switch array 38 uses the inputs that it receives from either the decode logic 36 or the successive approximation register 26 to determine which voltage tap to couple to the RDAC output. In the present embodiment, each unique pattern of inputs causes the switch array 38 to couple a different voltage tap to the RDAC output. When testing is not being performed, the resistor DAC 32 operates in the same manner as prior art devices. Aside from the resistor test logic 44 and the resistor DAC test output signal, the logic in resistor DAC 32 operates in the same manner as prior art devices.

Resistor test logic 44 receives control signals, the RDAC output signal, and the voltage reference low signal as inputs. Resistor test logic 44 produces the resistor DAC test output signal.

Figure 5:
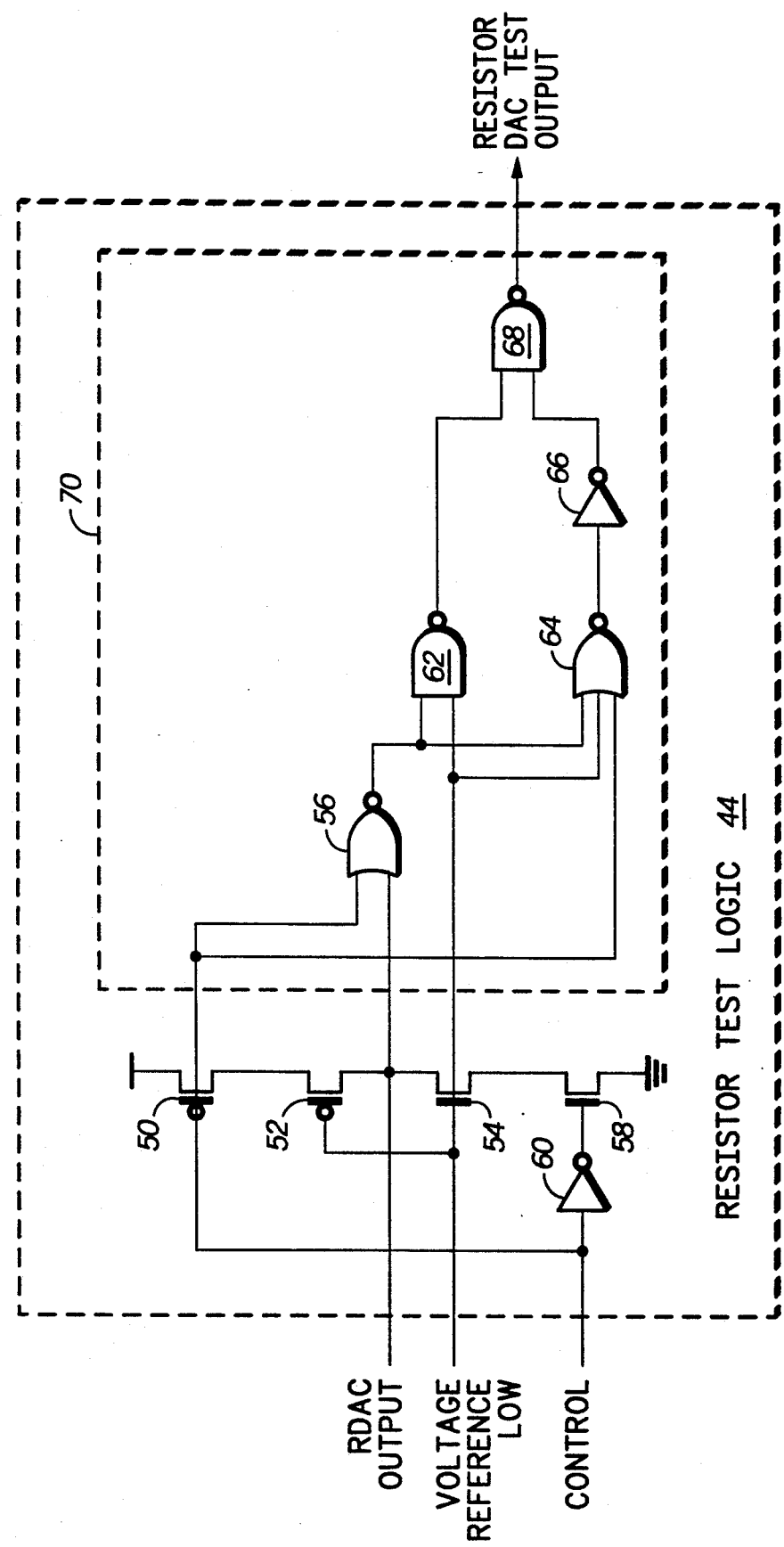
FIG. 5 illustrates, in logic diagram form, a resistor test logic circuit of FIG. 4 in accordance with one embodiment of the present invention.

FIG. 5 illustrates one implementation of the resistor test logic 44 of FIG. 4. Transistor 50 is a p-channel MOSFET that has a source coupled to a positive power supply voltage, a drain coupled to a source of transistor 52, and a gate coupled to a control signal. Transistor 52 is a p-channel MOSFET that has a gate coupled to the voltage reference low and a drain coupled to the RDAC output signal, a drain of transistor 54, and an input of NOR gate 56. The control signal is the other input of NOR gate 56. Transistor 54 is an n-channel MOSFET that has a gate coupled to the voltage reference low and a source coupled to a drain of transistor 58. The control signal is the input to an inverter 60. The output of inverter 60 is the input to a gate of transistor 58. Transistor 58 is an n-channel MOSFET that has a source coupled to ground.

Voltage reference low is an input to both a NAND gate 62 and a NOR gate 64. Also, the output of NOR gate 56 is an input to both NAND gate 62 and NOR gate 64. In addition, the control signal is an inptut to NOR gate 64. The output of NOR gate 64 is the input to an inverter 66. The output of inverter 66 and the output of NAND gate 62 are both inputs to a NAND gate 68. The output of NAND gate 68 is the resistor DAC test output signal.

In operation, transistor 52 acts as a weak pull-up transistor and transistor 54 acts as a weak pull-down transistor. The control signal acts as an enable for the weak pull-up transistor and the weak pull-down transistor by turning on both transistor 50 and transistor 58. A combination of gates 70 performs an exclusive-OR (XOR) function with the control signal acting as an enable for the XOR function.

The resistor test logic 44 is not used during normal operation, but is only used during a special test mode in order to perform tests that do not require any analog to digital conversions. The purpose of this special test mode is to allow functional testing of ADC 14 using resistor test logic 44. In some embodiments, other test modes that do not require the use of resistor test logic 44 may additionally be used to allow further functional testing of ADC 14. Resistor test logic 44 is not part of the circuitry that is required in order to perform an analog to digital conversion. In fact, resistor test logic 44 is never used when analog to digital conversions are being performed by ADC 14.

When ADC 14 is in special test mode, the control signal will be at digital logic level zero which enables the resistor test logic 44 to perform a test. When ADC 14 is not in test mode, the control signal will be at digital logic level one which disables the resistor test logic 44 and prevents it from performing a test. In order to conserve power, resistor test logic 44 is not enabled except when it is performing its specialized test functions while in special test mode.

If the resistor array 42, the switch array 38, and the optional decode logic 36 are functioning properly, then a conductive path will exist from voltage reference low through resistor array 42 and switch array 38 to the RDAC output. This conductive path is stronger than transistor 52 or transistor 54 and should therefore force the RDAC output to be logically equal to voltage reference low. If the RDAC signal and the voltage reference low signal are the same, then the resistor DAC test output is a logical "0" which indicates that the test was passed and no error was found. But if the RDAC signal and the voltage reference low signal are different, then the resistor DAC test output is a logical "1" which indicates that the test was failed and an error or defect was found in the circuitry.

Referring to FIG. 4 and FIG. 5, the resistor test logic 44 can be used to test for certain open circuits and short circuits in the resistor array 42, the switch array 38, and the decode logic 36. In order to perform a test, the test logic is enabled by driving the control signal to a logical "0". One end of resistor array 42 is driven with a known digital logic level. In this particular embodiment, the end of resistor array 42 which is coupled to the voltage reference low is driven with a digital voltage that corresponds to a known digital logic level. This driven end of resistor array 42 is also coupled to the gates of weak pull-up transistor 52 and weak pull-down transistor 54. The other end of resistor array 42, the end coupled to the voltage reference high, is not driven to a known voltage but is allowed to float.

For a "stuck at one" test, the known voltage applied to resistor array 42 is a logical "0". And for a "stuck at zero" test, the knwon voltage applied to resistor array 42 is a logical "1". Both tests must be performed as many times as there are voltage taps. Each of the voltage taps must be coupled, one at a time, to RDAC output in order to determine if there are any opens or shorts in any of the logic paths being used for that particular voltage tap.

The following table describes the values of RDAC output, voltage reference low, and the output of NAND gate 68 for both the "stuck at zero" test and the "stuck at one" test. The normal case in the left-hand column indicates values which show that the logic being tested is operating normally. The failure case in the right-hand column indicates values which show that there is a failure somewhere in the resistor array 42, the switch array 38, or the decode logic 36. The successive approximation register 26, shown in FIG. 2, can be written to across bus 16. Thus, using the successive approximation register 26, it is possible to select which one voltage tap is to be coupled to the RDAC output signal for a particular test.

| Normal Case | Failure Case |
| --- | --- |
| Stuck at ZERO Test (voltage reference low is driven to a logical "1") | |
| RDAC output = 1 | RDAC output = 0 |
| voltage reference low = 1 | voltage reference low = 1 |
| \| | \| |
| output of NAND gate 68 = 0 | output of NAND gate 68 = 1 |
| Stuck at ONE Test (voltage reference low is driven to a logical "0") | |
| RDAC output = 0 | RDAC output = 1 |
| voltage reference low = 0 | voltage reference low = 0 |
| \| | \| |
| output of NAND gate 68 = 0 | output of NAND gate 68 = 1 |

For both the "stuck at zero" test and the "stuck at one" test, if the output of NAND gate 68 is a logical "1", there is a failure in the resistor array 42, the switch array 38, or the decode logic 36. If resistor DAC test output is ever a logical "1", it indicates that there is a failure severe enough to prevent the analog to digital converter (ADC) 14 from operating properly. Thus if resistor DAC test output is ever a logical "1", the ADC 14 should be considered non-functional and no further time should be wasted on testing the ADC 14.

There is a trade-off between the amount of test circuitry added and the amount of testing coverage achieved. Generally, the more test circuitry used, the greater the test coverage. The goal is to achieve the greatest test coverage with the least amount of test circuitry. Neither the "stuck at zero" test nor the "stuck at one" test detects a defect or error in the switch array 38 due to an analog switch that is stuck on. Testing for this defect would have required additional circuitry. However, in this embodiment, switch array 38 consists of two levels of multiplexing switches in series and the associated drive circuits in decode logic 36. Therefore, the probability was quite low that two switches in series in switch array 38 would be switched on simultaneously due to a manufacturing defect.

In normal operation both reference voltages, voltage reference high and voltage reference low, are analog voltage levels that must meet the following requirements:

$$(VDD-VSS)/2 \leq VRH \leq VDD$$

and $$VSS \leq VRL \leq (VDD-VSS)/2$$

where
VRH = voltage reference high
VRL = voltage reference low
VSS = ground
VDD = positive power supply voltage.

In the special test mode, voltage reference low is a test input that is supplied by digital test equipment. In this special test mode, voltage reference low must conform to the voltage requirements of valid digital logic levels. In the present embodiment, a digital logic level zero corresponds to a voltage very near to VSS, and a digital logic level one corresponds to a voltage very near to VDD. A digital logic level one and a digital logic level zero in a typical CMOS (Complementary Metal Oxide Semiconductor) embodiment, such as the present embodiment, must meet the following requirements:

$$0.7 VDD \leq VD1 \leq VDD$$

and $$VSS \leq VD0 \leq 0.2 VDD$$

where
VD1 = voltage for a digital logic level one
VD0 = voltage for a digital logic level zero
VSS = ground
VDD = positive power supply voltage.

As an example, in one embodiment of the present invention VDD is 5 volts and VSS is 0 volts. Thus in this embodiment, the VRH analog voltage level can range from 2.5 to 5 volts, and the VRL analog voltage level can range from 0 to 2.5 volts. A digital voltage level, on the other hand, is limited to a narrower range of voltages. In the same embodiment, the voltage for a digital logic level one must only range between 3.5 and 5 volts, and a digital logic level zero must only range between 0 and 1 volts. Note that values of VDD and VSS other than 5 volts and 0 volts may be used in other embodiments. For example, some CMOS (complementary metal oxide semiconductor) circuitry uses VDD equal to 3 volts. Other circuit technologies, such as TTL (transistor to transistor logic), require different values for VDD and VSS.

Resistor test logic 44 is not part of the circuitry that is required in order to perform an analog to digital conversion. In fact, resistor test logic 44 is not used during normal operation, but is only used during a special test mode in order to perform tests that do not require any analog to digital conversions. The purpose of the special test mode is to allow basic digital functional testing of ADC 14.

When ADC 14 is not in special test mode, but is performing normal analog to digital conversions, analog voltage levels are placed on voltage reference low and voltage reference high. Thus the inputs to resistor test logic 44, namely voltage reference low and RDAC output, are analog voltage levels. CMOS circuitry typically experiences a significant increase in power dissipation when analog voltage levels are used as inputs. Also, CMOS circuitry may produce invalid digital voltage levels as outputs when analog voltage levels are used as inputs. Resistor test logic 44, although it is a CMOS circuit, has been designed to overcome these problems.

When ADC 14 is not in special test mode, the control input, inverter 60, transistor 50, and transistor 58 are used to disable resistor test logic 44 in such a manner that it does not dissipate significantly more power when it receives analog voltage levels as inputs on voltage reference low and RDAC output. In addition, when ADC 14 is not in special test mode, the control input forces the output of the combination of gates 70, resistor DAC test output, to a known digital logic level, namely logic level zero. If resistor test logic 44 was not disabled during normal operation, resistor test logic 44 would alter the RDAC output signal and would thus produce linearity errors.

When ADC 14 is in special test mode, digital voltage levels are used as test inputs. A digital voltage level is placed on voltage reference low and voltage reference high is allowed to float. Thus, in special test mode, the voltage reference low is no longer an analog voltage level, but must now be a digital voltage level that corresponds to a valid digital logic level. Likewise, in special test mode, RDAC output is also a digital voltage level that corresponds to a valid digital logic level. Similarly, the test output, resistor DAC test output, which is only generated in this special test mode, is also a valid digital logic level. Thus in special test mode, resistor test logic 44 received digital inputs and generates a digital output, namely resistor DAC test output.

So in the special test mode, only a voltage that corresponds to a valid digital logic level is applied to the voltage reference low pin as a test input and only a voltage that corresponds to a valid digital logic level is generated as a test output on the resistor DAC test output signal. But, when ADC 14 is not in special test mode, voltage reference low and RDAC output, which are received by resistor test logic 44 as inputs, are both analog voltages that are not required to meet the specifications of valid digital logic levels. Resistor test logic 44 is thus a digital circuit that receives analog inputs when resistor test logic 44 is disabled and not performing tests, but receives digital inputs when resistor test logic 44 is enabled and performing tests.

Resistor test logic circuitry 44 thus allows a very fast digital functional test of some of the basic analog and digital circuitry of ADC 14 without requiring ADC 14 to perform time consuming analog to digital conversions using analog inputs. Without resistor test logic circuitry 44, a number of analog to digital conversions would have to be performed by the ADC 14 in order to try and infer from the conversion values whether the resistors 40 and the switch array 38 indeed operated correctly.

In addition, resistor test logic circuitry 44 allows fault grading of a set of analog nodes that is otherwise difficult to fault grade in a chip design, namely the intermediate nodes between each resistive value and the RDAC output. Fault grading of this set of nodes not only allows the resistor array 42 to be tested, but in addition, allows the switch array 38 and the decode logic 36 to be tested.

As was previously mentioned, the analog circuitry in ADC 14 can indeed be tested using analog inputs. But special analog test equipment is required to supply analog inputs and the tests are very time consuming and expensive because of the large number of analog to digital conversions required. Also, testing using analog inputs may not catch certain defects. Thus testing using digital inputs saves test time, is less expensive, and may result in more thorough test coverage.

Also, if a non-binary weighted scheme is used in the digital to analog converter 24 (shown in FIG. 2), then decode logic 36 (shown in FIG. 4) may be required and its functionality must be tested. Resistor test logic circuitry 44 allows the functionality of decode logic 36 to be tested without the necessity of using a very time consuming full ramp test. It must be noted, however, that if no errors are found using resistor test logic circuitry 44, that is if resistor DAC test output is never a logical "1", then a full ramp test may still be required in order to test the linearity of the ADC 14.

In summation, for a minimal amount of added circuitry, the testability of ADC 14 has been significantly improved. Very fast functional tests of some of the basic circuitry of ADC 14 can be performed without requiring ADC 14 to perform time consuming analog to digital conversions. In addition, fault grading of specific circuitry within ADC 14 can be more easily and accurately performed.

While the present invention has been illustrated and described with reference to specific embodiments, further modifications and improvements will occur to those skilled in the art. For example, the data processing system 10 may or may not be contained on a single semiconductor chip. As an example of this, processing unit 12 may be contained on a semiconductor chip and analog to digital converter (ADC) 14 may not be contained on that same semiconductor chip. Although compare logic 18 is shown as external to data processing system 10, compare logic 18 may alternately be part of data processing system 10, and may even be part of ADC 14. In one embodiment, the compare logic 18 is part of an external testing apparatus (not shown). Bus 16 may be a serial bus, a parallel bus, or a time multiplexed bus.

The digital to analog converter (DAC) 24 may internally use only resistors, or may internally use both capacitors and resistors as is shown in FIG. 3. If DAC 24 only uses resistors, then capacitor DAC 30 is not required, multiplexer 34 is not required, and the resistor DAC test output signal is the same as the actual test output signal. Resistor array 42 may or may not use a non-binary weighted scheme. The information from the successive approximation register 26 may or may not be decoded by optional decode logic 36 before being input to switch array 38.

The functions performed by resistor test logic 44 may be implemented in various ways. Different circuitry could be used to perform the exclusive-OR (XOR) function which is performed in the present embodiment by the combination of gates 70. The "XOR" function performed by the combination of gates 70 is not required, but is merely used to condense the results of the testing into a single pass/fail signal.

It is to be understood, therefore, that this invention is not limited to the particular forms illustrated and that it is intended in the appended claims to cover all modifications that do not depart from the spirit and scope of this invention.

We claim:

1. Test apparatus for testing circuitry in an analog to digital converter (ADC) which has a plurality of resistors connected in series to form a resistor array with a first end and a second end, the test apparatus comprising:

first logic means coupled to the first end of the resistor array, for applying an analog voltage level to the first end of the resistor array when the ADC is not in a special test mode, and for applying a first digital voltage level to the first end of the resistor array when the ADC is in the special test mode;

second logic means coupled to at least two of the plurality of resistors for selectively coupling a portion of the resistor array to an output signal having a second voltage level which is analog when the ADC is not in the special test mode and which is digital when the ADC is in the special test mode; and third logic means used only in the special test mode, coupled to the second logic means and the first end of the resistor array, for comparing the first voltage level of the first end of the resistor array to the second voltage level of the output signal for producing a comparison result.

2. The test apparatus according to claim 1, further comprising:

a storage means for receiving and storing a digital value that determines which of the plurality of resistors will be included in the portion of the resistor array that is coupled to the output signal by the second logic means.

3. The test apparatus according to claim 2 wherein the storage means receives the digital value from a source external to the analog to digital converter (ADC) only when the ADC is in the special test mode.

4. The test apparatus according to claim 2, further comprising:

a transferring means coupled to the storage means and the second logic means for transferring the digital value from the storage means to the second logic means.

5. The test apparatus according to claim 2, further comprising:

a decoding means coupled to the storage means and the second logic means for decoding the digital value.

6. The test apparatus according to claim 1 wherein the analog to digital converter (ADC) is located on a semiconductor chip and the test apparatus is also located on that same semiconductor chip.

7. The test apparatus according to claim 1, further comprising:

a control means coupled to the third logic means for enabling the third logic means to compare the first voltage level to the second voltage level.

8. The test apparatus according to claim 7, wherein the control means enables the third logic means only when the analog to digital converter (ADC) is in the special test mode.

9. The test apparatus according to claim 1, further comprising:

fourth logic means coupled to the third logic means for transmitting the comparision result outside of the analog to digital converter (ADC).

10. The test apparatus according to claim 1 wherein the third logic means determines, based upon the comparison result, whether there is a conductive path from the first end of the resistor array to the output signal.

11. The test apparatus according to claim 1 wherein the third logic means uses an exclusive-OR function.

12. A method of testing an analog to digital converter (ADC) comprising a plurality of resistors connected in series to form a resistor array with a first end and a second end, the method comprising the step of:

performing a test that does not require an analog to digital conversion, the test further comprising the steps of:

placing the analog to digital converter (ADC) in a special test mode;

writing a value into a storage means;

using the value to determine which portion of the resistor array to couple to an output signal;

placing a first digital voltage level on the first end of the resistor array; and comparing the first digital voltage level of the first end of the resistor array to a second digital voltage level of the output signal to produce a comparison result.

13. The method according to claim 12 further comprising the step of:

determining, based upon the comparison result, whether there is a conductive path from the first end of the resistor array to the output signal.

14. The method according to claim 12 wherein the step of using the value to determine which portion of the resistor array to couple to an output signal further comprises the step of:

decoding the value.

15. The method according to claim 12 further comprising the step of:

using a control signal to enable comparison of the first digital voltage level to the second digital voltage level.

16. The method according to claim 15 wherein the step of using a control signal to enable comparison of the first digital voltage level to the second digital voltage level is only performed when the analog to digital converter (ADC) is in the special test mode.

17. The method according to claim 12 further comprising the step of:

transferring the comparison result outside of the analog to digital converter (ADC).

18. The method according to claim 12 wherein the step of comparing the first digital voltage level to the second digital voltage level further comprises the step of:

using an exclusive-OR function.

19. Test apparatus for testing circuitry in an analog to digital converter (ADC) which has a plurality of resistors connected in series to form a resistor array with a first end and a second end, the test apparatus comprising:

first logic means coupled to the first end of the resistor array, for applying an analog voltage level to the first end of the resistor array when the ADC is not in a special test mode, and for applying a first digital voltage level to the first end of the resistor array when the ADC is in the special test mode;

second logic means coupled to at least two of the plurality of resistors for selectively coupling a portion of the resistor array to an output signal having a second voltage level which is analog when the ADC is not in the special test mode and which is digital when the ADC is in the special test mode;

third logic means used only in the special test mode, coupled to the second logic means and the first end of the resistor array, for comparing the first voltage level of the first end of the resistor array to the second voltage level of the output signal for producing a comparison result;

fourth logic means coupled to the third logic means for transmitting the comparison result outside of the analog to digital converter (ADC);

a storage means for receiving and storing a digital value that determines which of the plurality of resistors will be included in the portion of the resistor array that is coupled to the output signal by the second logic means; and a control means coupled to the third logic means for enabling the third logic means to compare the first voltage level to the second voltage level.

20. The test apparatus according to claim 19, wherein the control means enables the third logic means only when the analog to digital converter (ADC) is in the special test mode.

* * * * *